US006342004B1

(12) United States Patent
Lattimore et al.

(10) Patent No.: US 6,342,004 B1
(45) Date of Patent: Jan. 29, 2002

(54) AUTOMATIC FIRE SHUTTER MECHANISM FOR RACK MOUNTED CHASSIS SYSTEMS

(75) Inventors: James D. Lattimore, Safety Harbor; Micheal F. Erturk, Palm Harbor, both of FL (US)

(73) Assignee: Digital Lightwave, Inc.

( * ) Notice: Subject to any disclaimer, the term of this patent is extended or adjusted under 35 U.S.C. 154(b) by 0 days.

(21) Appl. No.: 09/516,905

(22) Filed: Mar. 1, 2000

(51) Int. Cl.[7] .................................................. H05K 7/20

(52) U.S. Cl. ........................... 454/184; 169/48; 169/57; 361/690; 361/694; 454/369

(58) Field of Search ................................ 361/690, 692, 361/694, 695; 454/184, 334, 342, 348, 358, 369; 137/79; 174/16.1; 169/48, 57, 63, 42

(56) References Cited

U.S. PATENT DOCUMENTS

| | | | | |
|---|---|---|---|---|
| 6,002,584 A | * | 12/1999 | Messmer et al. | 454/184 X |
| 6,101,768 A | * | 8/2000 | Springstead et al. | 454/334 X |

FOREIGN PATENT DOCUMENTS

| | | | | |
|---|---|---|---|---|
| FR | 2 233 549 | * | 1/1975 | 454/369 |
| FR | 2 338 091 | * | 8/1977 | 454/369 |
| GB | 2 161 918 | * | 1/1986 | 454/369 |
| JP | 1-253300 | * | 10/1989 | 361/694 |

* cited by examiner

*Primary Examiner*—Harold Joyce
(74) *Attorney, Agent, or Firm*—Holland & Knight LLP

(57) ABSTRACT

A shutter mechanism for rack mounted chassis systems, comprising a first apertured shutter and a second apertured shutter, the first apertured shutter having a plurality of first holes formed therein in a first pattern, the second apertured shutter having a plurality of second holes formed therein in a second pattern, the first holes and the first pattern being configured relative to the second holes and the second pattern such that the shutters are positionable in a non-aligned position blocking air flow therethrough and in an aligned position allowing air flow therethrough, the shutters being movable to the non-aligned position when exposed to a temperature above a predetermined amount and means for positioning the first apertured shutter adjacent to the second apertured shutter allowing relative slidable movement thereof.

17 Claims, 3 Drawing Sheets

AUTOMATIC FIRE SHUTTER MECHANISM FOR RACK MOUNTED CHASSIS SYSTEMS

BACKGROUND OF THE INVENTION

1. Field of the Invention

This invention relates to rack mounted chassis systems employed in central offices. More particularly, this invention relates to mechanisms for preventing the propagation of fire through such rack mounted chassis systems.

2. Description of the Background Art

Often fire safety requirements prohibit the easy propagation of fire in central offices and other facilities where rack mounted chassis systems are often deployed. Specifically, the rack mounted chassis systems typically include a plurality of chassis that are mounted in aligned racks. Each chassis typically includes aligned vents to provide for the natural convection cooling upwardly through each of the chassis. Unfortunately, this path for natural convection cooling also creates a path or chimney for the propagation of fire.

Therefore, it is an object of this invention to provide an improvement which overcomes the aforementioned inadequacies of the prior art devices and provides an improvement which is a significant contribution to the advancement of the rack mounted chassis art.

Another object of this invention is to provide a shutter mechanism for blocking the propagation of fire through rack mounted chassis systems.

Another object of this invention is to provide a shutter mechanism comprising at least a pair of apertured shutters which are placed in an overlapping contiguous manner and moveable between (1) an aligned position (i.e., open) wherein the holes in the apertured shutters are aligned and (2) a blocking position (i.e., closed) wherein the holes in the apertured shutters are not aligned such that the shutter mechanism may be employed within rack-mounted chassis systems to allow the free-flow of air therethrough and upon sensing a fire condition, to block the propagation of fire therethrough.

Another object of this invention is to provide a shutter mechanism including alignable shutters of material having alignable holes therethrough, wherein such shutters are spring-loaded to be urged toward a non-aligned position, but held in such an aligned position by means of a fusible link which fuses upon exceeding a predetermined temperature whereupon the shutters are then urged to the non-aligned or closed position so as to stop the propagation of fire therethrough.

The foregoing has outlined some of the pertinent objects of the invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

For the purpose of summarizing this invention, this invention comprises a shutter mechanism for minimizing the opportunity for fire to spread by shutting off the vents often used in a natural convection cooled chassis. It accomplishes this by reacting automatically to the intense heat build-up of a present flame.

More particularly, the automatic fire shutter mechanism of the invention is intended to be employed within rack-mounted chassis systems. The shutter mechanism comprises a pair of apertured shutters, each of which include a plurality of holes therethrough. The holes within the respective shutters are patterned so as to be capable of being aligned with each other to allow the free flow of air therethrough and such that when the holes are non-aligned, the air flow is blocked and there is no path for the free passage of fire therethrough.

In the preferred embodiment, the shutters are spring-loaded to constantly urge the shutters into a non-aligned or closed position, but are normally retained in an aligned or open position by means of a fusible link. The fusible link preferably comprises a heat-sensitive material which fuses (i.e., breaks or melts) when the temperature exceeds a predetermined amount, whereupon the spring mechanism then urges the shutters to a non-aligned position to block the passage of fire therethrough. Accordingly, the chimney effect that would normally occur in prior art chassis systems is blocked upon closing of the shutters to their non-aligned position.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

The shutter mechanism 10 of the invention comprises two thin apertured shutters 20A & 20B, each having a pattern of a plurality of holes 30. Preferably, the thin apertured shutters 20A and 20B are planar in configuration and are composed of an inflammable material such as metal. The shutters 20A and 20B are secured in an overlapping and contiguous position parallel and adjacent to each other and within opposing side guides 22A and 22B that are generally U-shaped or L-shaped in cross-section. Preferably, at least one of the guides (e.g., 22A) is fixedly secured to the opposing side of one of the shutters (e.g., 20A) allowing the other shutter (e.g. 20B) to slide longitudinally along the surface thereof. The opposing side guides 22A and 22B provide longitudinal rigidity to the shutter mechanism 10 and may also serve to align the shutters 20A & 20B in longitudinal alignment with each other; however, in early prototypes, too of close tolerances, have been found to cause binding.

Figure 1:
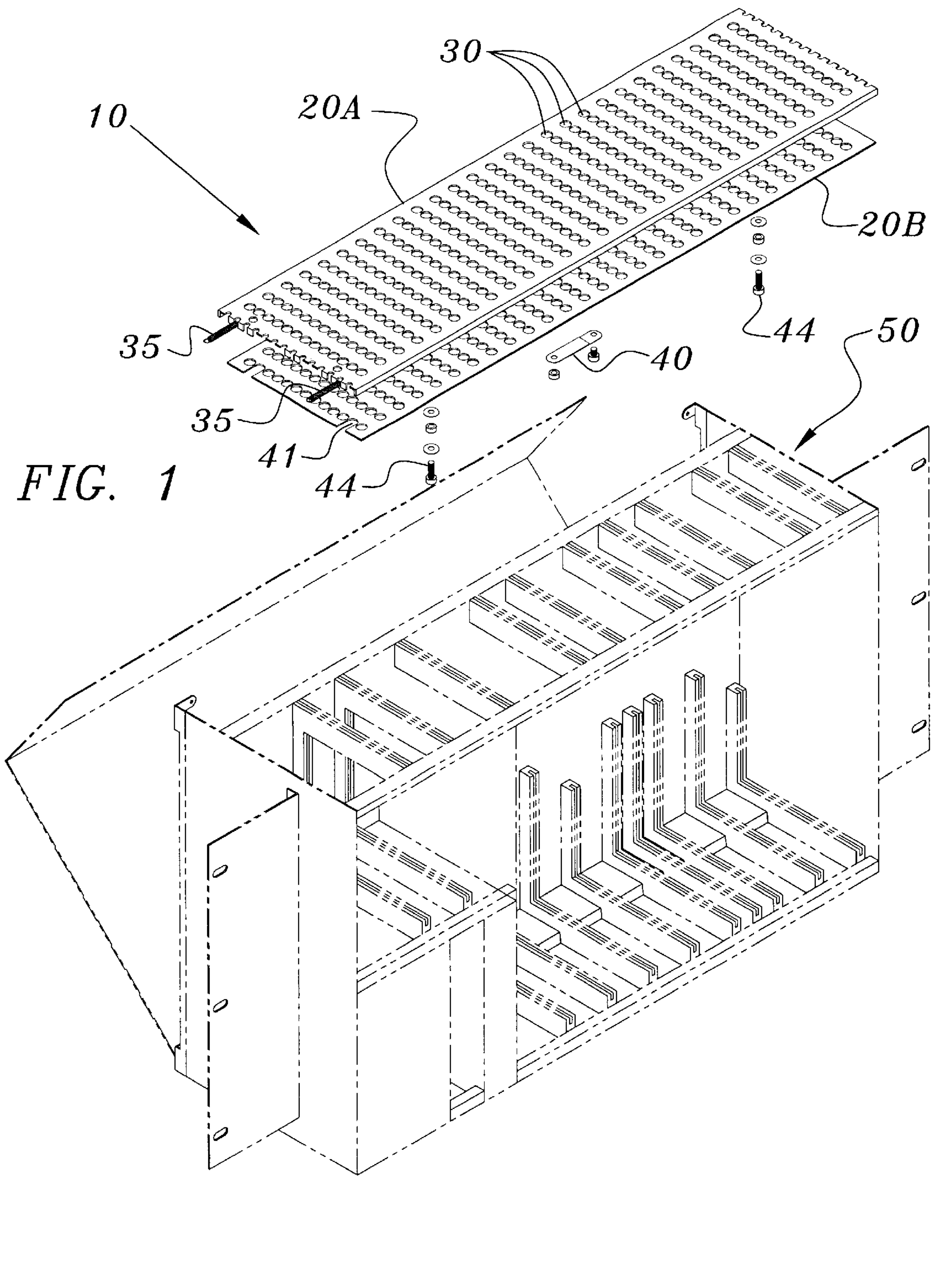
FIG. 1 is a perspective view, partially exploded, of a typical chassis showing the intended placement of the shutter mechanism of this invention.
Figure 2:
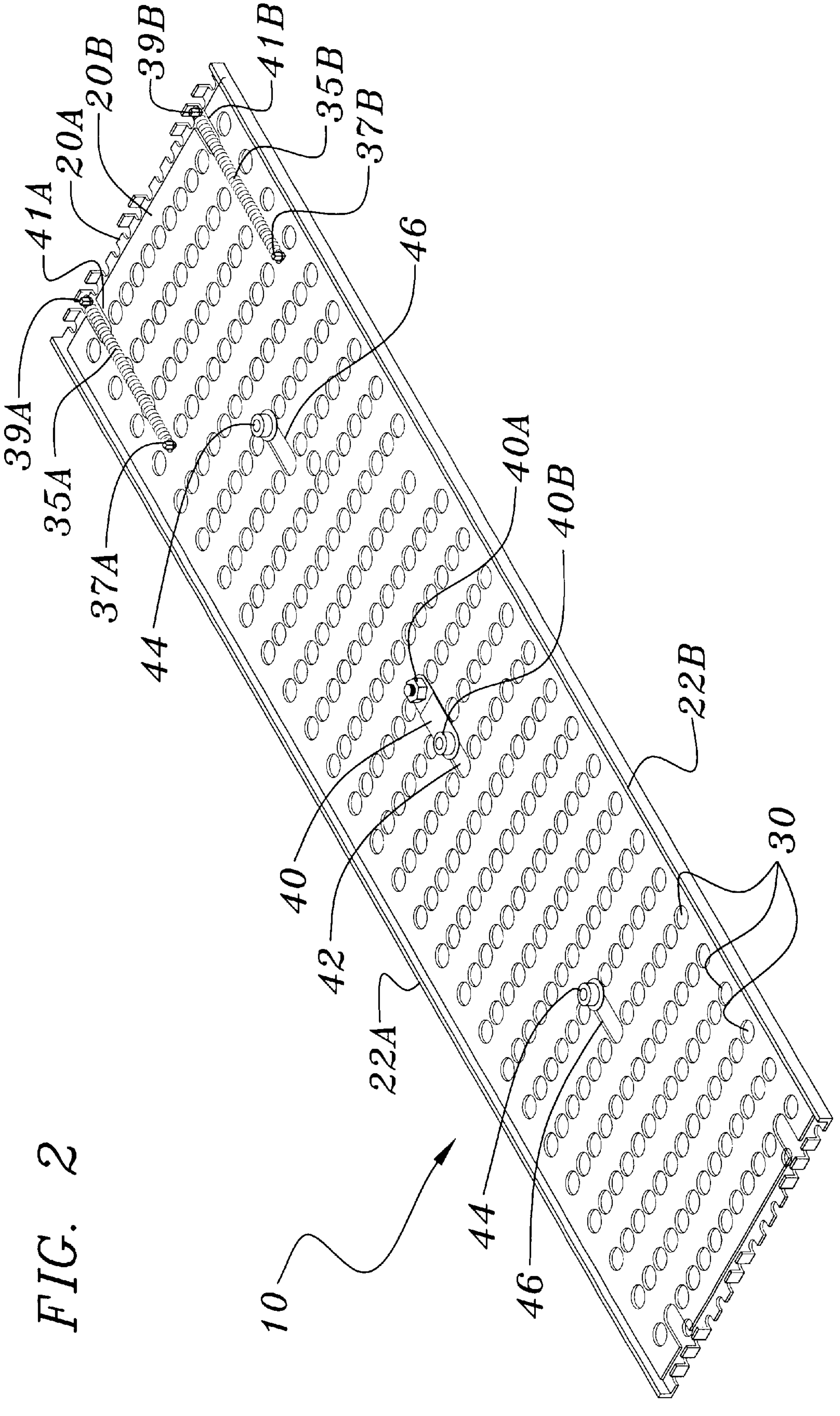
FIG. 2 is a perspective view of the shutter mechanism of the invention.
Figure 3:
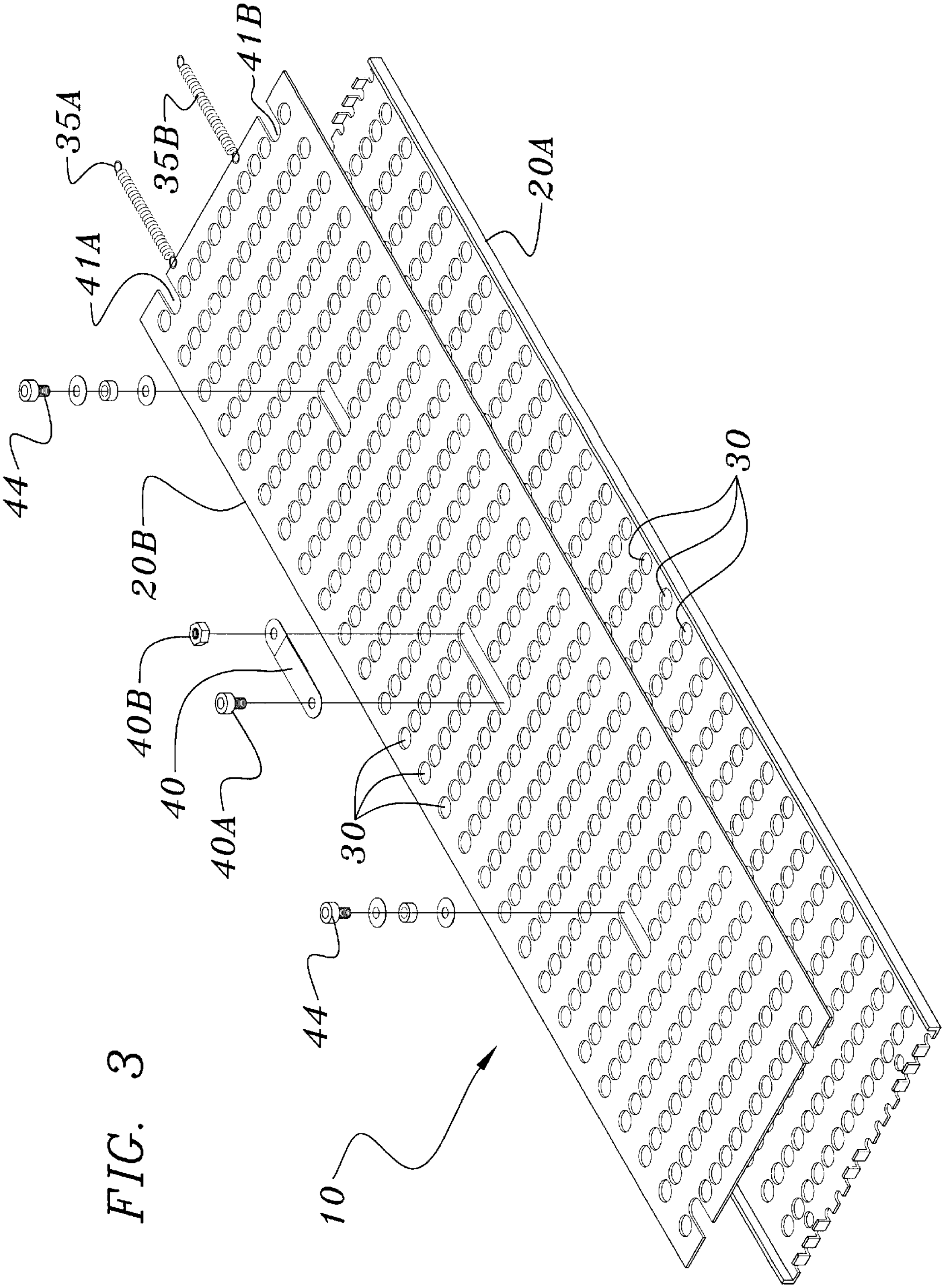
FIG. 3 is an exploded perspective view of the shutter mechanism of the invention.

As illustrated in FIGS. 2 and 3, the pattern of the plurality of holes 30 essentially comprise the same pattern for the respective shutters 20A and 20B. Thus, when the pattern of holes 30 of one shutter 20A is aligned with the pattern of holes 30 of the other shutter 20B a free flow of air may pass therethrough. However, upon sliding of one of the shutters 20B longitudinally relative to the other shutter 20A such that the holes 30 are in a non-aligned position, there is no passageway for the flow of air from one side of the shutter mechanism 10 to the other. In this regard, it is noted that the pattern and configuration of the respective holes 30 of the respective shutters 20A and 20B need not necessarily be the same provided the holes 30 are configured in a pattern which is alignable to allow passage of the air therethrough and provided the shutters 20A and 20B may be non-aligned to prevent the passage of air therethrough in the event of a fire. For example, the patterns may the same with the hole configurations being different and, conversely, the hole configurations may the same with the patterns being different, provided the shutters 20A and 20B may be moved to a non-aligned position to prevent the passage of air therethrough in the event of a fire.

The shutters 20A & 20B are movable from an "open" position with the hole 30 being in the aligned position to a "closed" position with the holes 30 being in the non-aligned position when the temperature exceeds a predetermined amount, thereby closing off the airflow through the shutter mechanism 10.

The movement of the shutters 20A & 20B may be accomplished by an active mechanism such as a dual-acting solenoid or a single-acting solenoid with a return spring, controlled by a temperature sensor (thermistor), such that the shutters 20A & 20B are urged to the "closed" position when the temperature exceeds a predetermined amount as sensed by the sensor.

However, in a preferred embodiment, movement of the shutters 20A & 20B may be accomplished by a passive mechanism that urges the shutters 20A & 20B to the "closed" position by means of spring mechanism 35 but holds the shutters 20A & 20B in the "open" by means of a heat-fusible link 40. The preferred structure of the spring mechanism 35 comprises springs 35A and 35B whose one ends are connected to protruding tabs 37A and 37B punched outwardly in a protruding manner from the movable shutter 20B and whose other ends are connected to corresponding tabs 39A and 39B punched outwardly in a protruding manner from the non-moveable shutter 20A. Alternatively, but less preferably, one of the ends of the springs 35A and 35B may be connected to the chassis 50 in which the shutter mechanism is installed instead of to the non-moveable shutter 20A. Also alternatively, by less preferably, in lieu of the springs 35A and 35B, a leaf or compression spring mounted within the chassis 50 in alignment with the movable shutter 20B such when the shutter mechanism 10 is installed in the chassis 50, the spring engages the movable shutter 20B to urge it toward the "closed" position.

It should be appreciated that the moveable shutter 20B is urged into a non-aligned position as shown in FIG. 2. The non-alignment of the holes 30 is assured by positioning tabs 39A and 39B that function as stops to U-shaped slots 41A and 41B formed in the shutter 20B such that non-alignment of the respective holes 30 is assured once the link 40 fuses.

The fusible link 40 is composed of a material that is heat sensitive such that it breaks into two or melts once the link 40 is subjected to a predetermined temperature. The fusible link 40 is secured to the respective shutters 20A and 20B by means of a fastener 40A that is secured through a hole in the moveable sheet 20B, the head of which is essentially flush with the undersurface of the moveable sheet 20B so as to not obstruct the sliding of the shutters 20A and 20B. The other end of the fusible link 40 is connected by a fastener 40B to a stand-off 43 fixedly mounted (such as by swaging) to the non-moveable sheet 20A and that passes through a slot 42 formed in the movable shutter 20B. It should be appreciated that upon fusing of the link 40, springs 35A and 35B urge the movable shutter 20A to slide along the mating surface of the other shutter 20A to a position wherein the holes 30 are in a "closed" or "non-aligned" position, thereby blocking the flow of air (or fire) therethrough.

Further improvements to the shutter mechanism 10 of the invention may include one or more fasteners and springs positioned between washers 44 similarly connected to stand-offs 43 fixedly mounted (such as by swaging) to the non-moveable sheet 20A and that passes through corresponding slots 46 formed in the movable shutter 20B to prevent jamming, buckling or other separation of the shutters 20A and 20B that otherwise might occur upon exposure to excessive temperatures. Furthermore, it has been determined that the non-alignment of the holes 30 can additionally, or in lieu of the positioning tabs 39A and 39B, be assured by the slots 42 and 46 in which the stand-offs 43 slide functioning as stops such that non-alignment of the respective holes 30 is assured once the link 40 fuses.

The shutter mechanism 10 is intended to be positioned above a typical chassis 50 mounted in a rack; however, the shutter mechanism 10 may be positioned below a typical chassis 50 or above and below the chassis 50.

During operation with the shutter being in its "open" position by link 40, the natural convection cooling of the chassis 50 occurs as normal. In the event of a fire, the link fuses (i.e., melts) whereupon spring 35 forces the shutters 20A & 20B to slide to a position with the respective holes 30 being non-aligned, thereby "closing" the shutter mechanism 10.

The shutter time may be controlled by varying the force of the spring 35 and/or the fusibility of the link 40.

The shutter mechanism 10 of the invention enables an instrument to pass the fire propagation test requirements imposed commonly on rack mounted chassis used in the telecommunications industry (i.e., NEBS SR-3580) by containing flames from burning components inside the chassis. It accomplishes this while maintaining the form factor of the typical chassis design and without any significant degradation of cooling capacity. It is simple, reliable and inexpensive.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described,

What is claimed is:

1. A rack mounted chassis system, comprising in combination:

a chassis having a top opening;

a top shutter mechanism positioned over said top opening of said chassis, said shutter mechanisms having a generally planar configuration corresponding to said top opening of said chassis and including a first apertured shutter slidably connected to a second apertured shutter, said first apertured shutter having a plurality of first holes formed therein in a first pattern substantially throughout said generally planar configuration, said second apertured shutter having a plurality of second holes formed therein in a second pattern substantially throughout said generally planar configuration, said first holes and said first pattern being configured relative to said second holes and said second pattern such that said shutters are positionable in a non-aligned position blocking air flow therethrough and in an aligned position allowing air flow therethrough, said shutters being movable to the non-aligned position when exposed to a temperature above a predetermined amount.

2. The shutter mechanism as set forth in claim 1, further including means for urging said first apertured shutter to said non-aligned position and temperature sensitive means for retaining said shutter in said aligned position until exposed to a predetermined temperature whereupon said retaining means releases and allows said urging means to move said shutters to said non-aligned position.

3. The shutter mechanism as set forth in claim 1, wherein said first pattern is the same as said second pattern.

4. The shutter mechanism as set forth in claim 1, wherein said first holes are of the same configuration as that of said second holes.

5. The shutter mechanism as set forth in claim 1, wherein said shutters are planar in configuration and are contiguous with each other when positioned adjacent to each other.

6. The shutter mechanism as set forth in claim 5, wherein said positioning means comprises at least one fastener that maintains said shutters in contiguous and adjacent planar alignment while allowing said shutters to slide relative to one another without buckling.

7. The shutter mechanism as set forth in claim 1, wherein said positioning means comprises at least one guide into which is fitted said shutters to allow said shutters to slide relative to one another.

8. The shutter mechanism as set forth in claim 1, wherein said positioning means comprises opposing guides into which are fitted on opposing sides of said shutters to allow said shutters to slide relative to one another.

9. The shutter mechanism as set forth in claim 8, wherein said guides are fixedly connected to one of said shutters.

10. The shutter mechanism as set forth in claim 1, wherein said positioning means comprises a standoff connected to one shutter that slides within a slot of the other shutter.

11. The shutter mechanism as set forth in claim 10, wherein said standoff is fixedly connected to said one of said shutters.

12. The shutter mechanism as set forth in claim 1, wherein said urging means comprises at least spring interconnecting said shutters.

13. The shutter mechanism as set forth in claim 1, wherein said urging means comprises at least one spring urging one of said shutters to said non-aligned position.

14. The shutter mechanism as set forth in claim 12, wherein said spring interconnecting said shutters is connected to protruding tabs respectively formed in said shutters.

15. The shutter mechanism as set forth in claim 14, wherein at least one of said protruding tabs formed in one of said shutters functions as a stop to assure said shutters may properly slide to said non-aligned position.

16. The shutter mechanism as set forth in claim 1, further including a fusible link that retains said shutters in said aligned position against said shutters being urged into said non-aligned position.

17. The shutter mechanism as set forth in claim 16, wherein opposing ends of said fusible link are respectively connected to said shutters to retain said shutters in said aligned position until fusing whereupon said shutters may slide to said non-aligned position.

* * * * *